(12) United States Patent
Lee et al.

(10) Patent No.: US 9,117,503 B2
(45) Date of Patent: Aug. 25, 2015

(54) MEMORY ARRAY PLANE SELECT AND METHODS

(75) Inventors: Jong-Won Lee, San Francisco, CA (US); Gianpaolo Spadini, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 127 days.

(21) Appl. No.: 13/597,520

(22) Filed: Aug. 29, 2012

(65) Prior Publication Data

US 2014/0063888 A1    Mar. 6, 2014

(51) Int. Cl.
| | |
|---|---|
| G11C 13/04 | (2006.01) |
| G11C 8/12 | (2006.01) |
| G11C 5/02 | (2006.01) |
| G11C 13/00 | (2006.01) |
| G11C 11/16 | (2006.01) |

(52) U.S. Cl.
CPC *G11C 8/12* (2013.01); *G11C 5/025* (2013.01); *G11C 11/1653* (2013.01); *G11C 13/0004* (2013.01); *G11C 2213/71* (2013.01)

(58) Field of Classification Search
CPC .......... G11C 13/0004; G11C 13/0069; G11C 11/5678; G11C 2213/79; G11C 13/004
USPC ........... 365/163, 151, 189.09, 189.16, 185.24
See application file for complete search history.

(56) References Cited

U.S. PATENT DOCUMENTS

| | | | |
|---|---|---|---|
| 7,426,135 B2 | 9/2008 | Lowrey et al. | |
| 7,839,673 B2 | 11/2010 | Lowrey | |
| 7,859,895 B2 | 12/2010 | Lowrey | |
| 8,345,472 B2 * | 1/2013 | Lee et al. | 365/163 |
| 2009/0231942 A1 | 9/2009 | Lee et al. | |
| 2010/0165716 A1 | 7/2010 | Kau et al. | |
| 2010/0226195 A1 | 9/2010 | Lue | |
| 2011/0013458 A1 | 1/2011 | Seol | |
| 2012/0025164 A1 | 2/2012 | Deweerd et al. | |
| 2012/0211722 A1 | 8/2012 | Kellam et al. | |
| 2013/0016557 A1 * | 1/2013 | Kim | 365/163 |

OTHER PUBLICATIONS

International Search Report and Written Opinion of international application No. PCT/US2013/057268, dated Dec. 30, 2013, 12 pp.
Kau, et al., "A Stackable Cross Point Phase Change Memory," Nov. 17, 2009, 4 pages, Intel Corporation, Technology and Manufacturing Group.
Ovshinsky, "New Transformative Possibilities for Ovonic Devices," Jul. 27, 2011, 8 pages.

(Continued)

*Primary Examiner* — Jason Lappas (74) *Attorney, Agent, or Firm* — Brooks, Cameron & Huebsch, PLLC (57) ABSTRACT

Memory arrays and methods of forming the same are provided. An example memory array can include at least one plane having a plurality of memory cells arranged in a matrix and a plurality of plane selection devices. Groups of the plurality of memory cells are communicatively coupled to a respective one of a plurality of plane selection devices. A decode logic having elements is formed in a substrate material and communicatively coupled to the plurality of plane selection devices. The plurality of memory cells and the plurality of plane selection devices are not formed in the substrate material.

14 Claims, 4 Drawing Sheets

(56) References Cited

OTHER PUBLICATIONS

Czubatyj, et al., "Invited Paper: Thin-Film Ovonic Threshold Switch: Its Operation and Application in Modern Integrated Circuits," Retrieved: Aug. 9, 2012, pp. 157-167, Electrionic Materials Letters, vol. 8, No. 2.
1 Office Action from related Taiwan patent application No. 102131360, dated May 18, 2015, 16 pp. X.

* cited by examiner

MEMORY ARRAY PLANE SELECT AND METHODS

TECHNICAL FIELD

The present disclosure relates generally to semiconductor devices and methods, and more particularly to apparatuses and methods for memory array plane select.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistance variable memory, and flash memory, among others. Types of resistance variable memory include phase change memory, programmable conductor memory, and resistive random access memory (RRAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Various memory devices can include a memory array. The memory array can include a plurality of memory cells. The plurality of memory cells can be arranged in one or more planes, each plane having memory cells organized in a cross point architecture. In such architectures, the memory cells can be arranged in a matrix of rows and columns. The memory cells can be located at the intersections of conductive lines. The memory device can include a plurality of vertically stacked planes. That is, the planes can be formed at different elevations from one another.

Decode logic, e.g., one or more decoders, associated with the memory array(s) can have elements, such as transistors, formed in the substrate material beneath the memory arrays. However, as the density of memory cells increases in a given area due to decreasing size of memory cells and/or planes of memory cells being stacked on top of one another, the footprint of decode logic can exceed the footprint of the memory array.

DETAILED DESCRIPTION

Memory arrays and methods of forming the same are provided. An example memory array can include at least one plane having a plurality of memory cells arranged in a matrix and a plurality of plane selection devices. Groups of the plurality of memory cells are communicatively coupled to a respective one of a plurality of plane selection devices. A decode logic having elements is formed in a substrate material and communicatively coupled to the plurality of plane selection devices. The plurality of memory cells and the plurality of plane selection devices are not formed in the substrate material.

Embodiments of the present disclosure can provide benefits such as reducing the quantity of elements, such as transistors comprising decode circuits, associated with a memory array formed in the substrate material. Reducing the quantity of elements associated with a memory array formed in the substrate material can reduce the physical footprint of decode logic and other circuitry associated with a memory array that is located below the memory array, and thus increase memory cell density.

According to various embodiments of the present disclosure, selection devices used to select individual planes of memory cells can be formed on the same plane as the memory devices. Forming plane selection devices on the same plane as the memory devices allows multiplexing circuits formed in the substrate material and associated with the memory array. Because individual planes can be selected, each plane of the memory array does not need its own dedicated decode circuitry, for example. That is, decode circuitry need not be uniquely associated with each plane of the memory array, and multiple planes of memory cells can be communicatively coupled in parallel through plane selection devices to a same decode circuitry. Forming the plane selection devices on the same plane as the memory devices reduces the footprint of circuitry associated with the memory array having elements formed in the substrate material by the plane selection devices not having to be formed in the substrate material.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. Also, as used herein, "a number of" a particular element and/or feature can refer to one or more of such elements and/or features.

Figure 1:
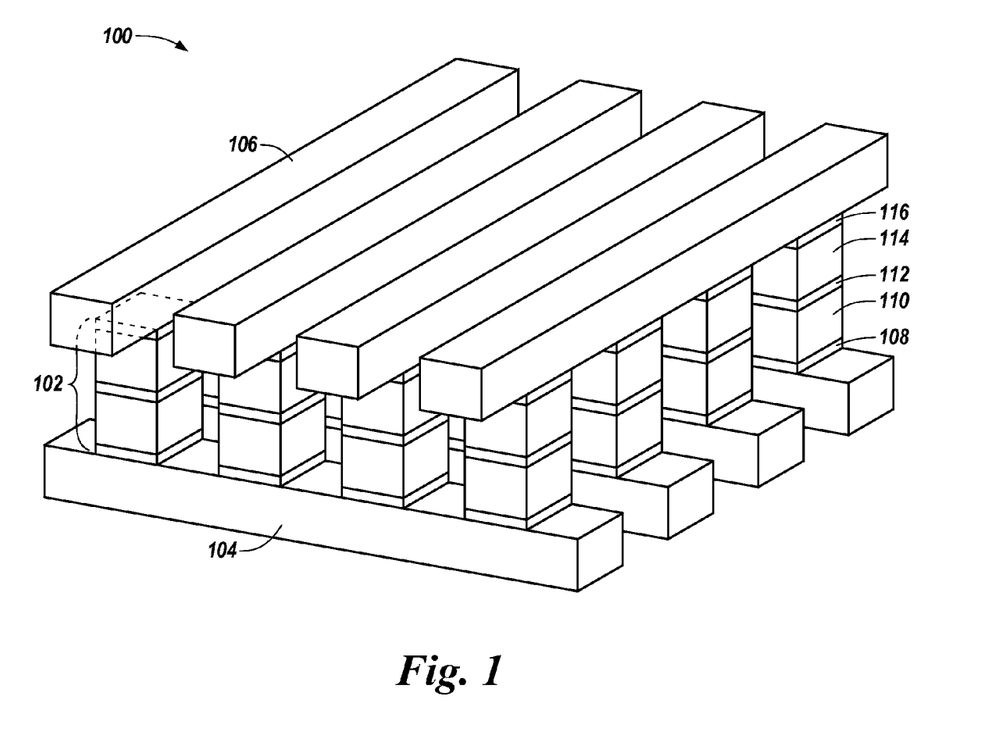
FIG. 1 illustrates a perspective view of a portion of a memory array in accordance with a number of embodiments of the present disclosure.
Figure 2A:
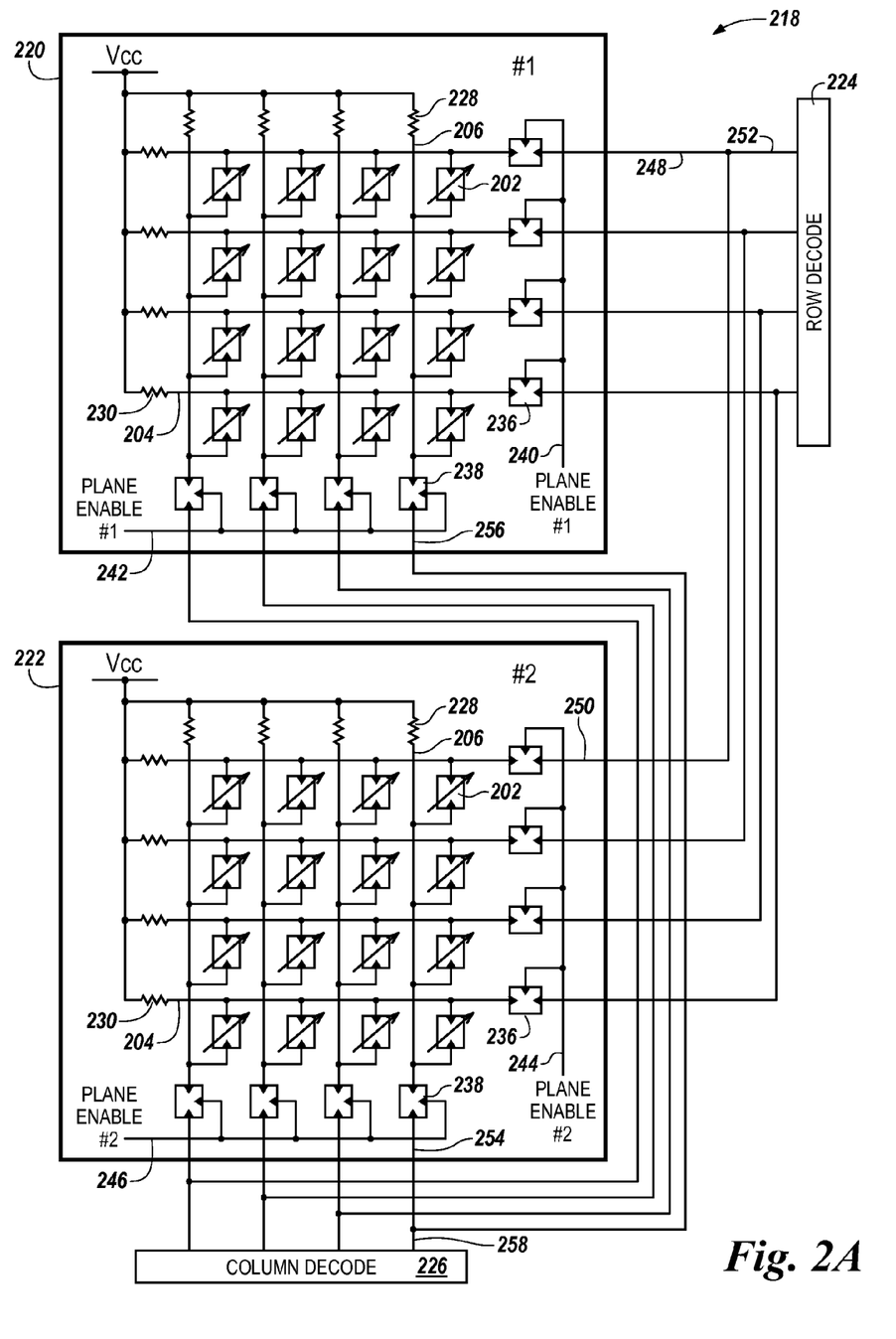
FIG. 2A is a schematic representation of a portion of a memory array formed having three-terminal plane select devices in a "common base" configuration of plane isolation in accordance with a number of embodiments of the present disclosure.

FIG. 1 illustrates a perspective view of a portion of a memory array 100 in accordance with a number of embodiments of the present disclosure. The memory array 100 can have a cross point architecture having memory cells 102 located at the intersections of a number of conductive lines 104, e.g., access lines, which may be referred to herein as word lines, and a number of conductive lines 106, e.g., data/sense lines, which may be referred to herein as bit lines. As illustrated, the word lines 104 are substantially parallel to each other and are substantially orthogonal to the bit lines 106, which are substantially parallel to each other. However, embodiments are not limited to a parallel/orthogonal configuration.

As used herein, the term "substantially" intends that the modified characteristic needs not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation.

In various embodiments, the memory cells 102 can have a "stack" structure. Each memory cell 102 can include a storage element connected in series with a respective cell select device, e.g., cell access device, formed between word lines 104 and bit lines 106. The storage element can be a resistance variable storage element. The resistance variable storage element may include a resistance variable storage element material 110 formed between a pair of electrodes, e.g., 108 and 112. The cell select device can include a cell select device material 114 formed between a pair of electrodes, e.g., 112 and 116.

The memory cells 102 of memory array 100 can comprise the cell select device in series with a phase change material, such that the memory array 100 can be referred to as phase change material and switch (PCMS) array. In a number of embodiments, the cell select device can be a two-terminal ovonic threshold switch (OTS), for instance. An OTS can include, for example, a chalcogenide material formed between a pair of conductive materials, e.g., conductive electrodes. Responsive to an applied voltage across the OTS that is less than a threshold voltage, the OTS can remains in an "off" state, e.g., an electrically nonconductive state. Alternatively, responsive to an applied voltage across the OTS that is greater than the threshold voltage, the OTS snapback to an "on" state. In the "on" state the OTS device can carry substantial current with a voltage at its terminals remaining almost constant to the so-called "holding voltage" level.

Embodiments of the present disclosure are not limited to PCMS cross-point arrays or a particular cell select switch. For instance, the methods and apparatuses of the present disclosure can be applied to other cross-point arrays such as arrays utilizing resistive random access memory (RRAM) cells, conductive bridging random access memory (CBRAM) cells, and/or spin transfer torque random access memory (STT-RAM) cells, among other types of memory cells, for example.

In embodiments in which the resistance variable storage element comprises a PCM, the phase change material can be a chalcogenide alloy such as an indium (In)-antimony (Sb)-tellurium (Te) (IST) material, e.g., $In_2Sb_2Te_5$, $In_1Sb_2Te_4$, $In_1Sb_4Te_7$, etc., or a germanium(Ge)-antimony(Sb)-tellurium(Te) (GST) material, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other phase change materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other examples of resistance variable materials include transition metal oxide materials or alloys including two or more metals, e.g., transition metals, alkaline earth metals, and/or rare earth metals. Embodiments are not limited to a particular resistive variable material or materials associated with the storage elements of the memory cells 102. For instance, other examples of resistive variable materials that can be used to form storage elements include binary metal oxide materials, colossal magnetoresistive materials, and/or various polymer based resistance variable materials, among others.

In a number of embodiments, an electrode can be shared between the cell select device and storage element of the memory cells 102. Also, in a number of embodiments, the word lines 104 and the bit lines 106 can serve as top or bottom electrodes corresponding to the memory cells 102.

In a number of embodiments, the resistance variable storage element material 110 can comprise one or more of the same material(s) as the cell select device material 114. However, embodiments are not so limited. For example, the resistance variable storage element material 110 and the cell select device material 114 can comprise different materials. According to various embodiments of the present disclosure, relative positioning of the resistive storage element material 110 and the cell select device material 114 can be reversed from that shown in FIG. 1.

The materials described herein may be formed by various thin film techniques including, but not limited to, spin coating, blanket coating, chemical vapor deposition (CVD) such as low pressure CVD, plasma enhanced chemical vapor deposition (PECVD), atomic layer deposition (ALD), plasma enhanced ALD, physical vapor deposition (PVD), thermal decomposition, and/or thermal growth, among others. Alternatively, materials may be grown in situ. While the materials described and illustrated herein may be formed as layers, the materials are not limited thereto and may be formed in other three-dimensional configurations.

Although not illustrated in FIG. 1, in a number of embodiments, the memory array 100 can be part of a three dimensional (3D) architecture, with a number of planes, e.g., tiles, decks, vertically stacked on each other. In such embodiments, conductive lines 104 and 106 can be communicatively coupled to the memory cell of one plane of the 3D array, for instance. Additionally, the memory array 100 can be connected, e.g., via conductive lines 104 and 106, to circuitry associated with the memory array, e.g., decode circuitry among various other circuitry associated with operating memory array 100. Elements, e.g., transistors, etc., of such circuitry associated with the memory array 100 can be formed to underlie memory array 100, for instance.

In operation, the memory cells 102 of memory array 100 can be programmed by applying a voltage, e.g., a write voltage, across the memory cells 102 via selected word lines 104, and bit lines 106. The width and/or magnitude of the voltage pulses across the memory cells 102 can be adjusted, e.g., varied, in order to program the memory cells 102 to particular data states, e.g., by adjusting the resistance level of the storage element.

A sensing, e.g., read, operation can be used to determine the logic state of a memory cell 102. For instance, particular voltages can be applied to a bit line 106 and word line 104 corresponding to a selected memory cell 102, and current through the cell responsive to a resulting voltage difference can be sensed. Sensing operations can also include biasing unselected word lines 104 and bit lines 106, e.g., word lines and bit lines connected to non-selected cells, at particular voltages in order to sense the data state of a selected cell 102.

The word lines 104 and bit lines 106 from each plane of memory cells can be connected to decoding circuits formed in the substrate material below the memory array and used to interpret the various signals, e.g., voltages and/or currents, on the word lines 104 and bit lines 106. The decoding circuits may include row decoding circuits for decoding the signals on word lines 104, and column decoding circuits for decoding signals on the bit lines 106.

As used in the present disclosure, the term "substrate" material can include silicon-on-insulator (SOI) or silicon-on-sapphire (SOS) technology, doped and undoped semiconductors, epitaxial layers of silicon supported by a base semiconductor foundation, conventional metal oxide semiconductors (CMOS), e.g., a CMOS front end with a metal backend, and/or other semiconductor structures and technologies. Various elements, e.g., transistors, and/or circuitry, such as decode circuitry for instance, associated with operating memory array 100 can be formed in/on the substrate material such as via process steps to form regions or junctions in the base semiconductor structure or foundation.

FIG. 2A is a schematic representation of a portion of a memory array 218 formed having three-terminal plane select devices 236/238 in a "common base" configuration of plane isolation in accordance with a number of embodiments of the present disclosure. According to a number of embodiments, the three-terminal plane select devices 236 and 238 can be an ovonic threshold switch (OTS) similar to the two-terminal OTS discussed above with respect to the cell select device, but with the addition of a third terminal to control the "firing" of the OTS. Control of the OTS device is through the third terminal. A three-terminal OTS is in a highly-resistive non-conducting "off" state until a pulse is applied to the third terminal, which turns on the three-terminal OTS, e.g., the three terminal OTS is in a conducting "on" state. The three-terminal OTS stays on after the control pulse is removed as long as a minimum holding current flows through the three-terminal OTS, e.g., as long as a minimum holding voltage is present across the three-terminal OTS.

The three-terminal OTS can be formed, for example, with the third terminal making contact to a portion of the active chalcogenide switching area, e.g., of a two-terminal device. Once the threshold voltage is exceeded, current flows through the third terminal to the lower electrode. There is little or no switchback because the third terminal is physically very close to the lower electrode and is resistive. Three-terminal OTS plane select devices 236 and 238 can be formed in the plane of memory array 218, in a similar manner by which two-terminal cell select devices are formed in the plane of a PCMS array.

Memory array 218 includes a plurality of memory cells 202. The memory array 218 is shown having a plurality of planes, including a first plane 220 and a second plane 222. Planes 220 and 222 can be formed in a vertical stacked configuration, for example, with plane 220 being formed at a different elevation than that at which plane 222 is formed. In a number of other embodiments, planes 220 and 22 can be formed at the same elevation over a substrate material.

Although two planes are shown in FIG. 2A, embodiments of the present disclosure are not limited to this quantity of planes. Embodiments of the present disclosure can be implemented with memory cells arranged into more, or fewer, planes. For simplicity, a limited number of memory cells 202 are shown in each plane of memory array 218. However, embodiments of the present disclosure are not limited to a particular quantity of memory cells, and can be implemented for a memory array having more or fewer memory cells.

The memory cells 202 of each plane are shown being arranged into a cross point architecture of rows and columns, e.g., a 4×4 matrix. One terminal of each memory cell 202 in a row is shown being communicatively coupled to a local conductive line, e.g., a local word line 204. One end of the local word line 204 is shown in FIG. 2A being connected to a resistance 230, and the other end of the local word line 204 is shown being connected to a first terminal of a corresponding plane select device 236, e.g., an emitter terminal of a three-terminal OTS.

However, embodiments of the present disclosure are not limited to the specific configuration illustrated in FIG. 2A, particularly with respect to the location of resistance 230 and/or the plane select device 236. That is, resistance 230 need not be located at an opposite ends of the local word line 204 from corresponding plane select device 236, and may be located nearer to the corresponding plane select device 236 and/or can be distributed resistance, e.g., embodied in a plurality of discrete resistive elements located in series with the local word line 204 and/or resistance resulting from the material used to form the local word line 204. The plane select device 236 can also located differently than shown in FIG. 2A in some configurations. For example, plane select device 236 and/or resistance 230 may be located away from the ends of the local word line 204, such as near the center of the local word line 204, among other locations. In another example, plane select device 236 and resistance 230 may be exchanged with respect to the locations shown in FIG. 2A.

A second terminal of the corresponding plane select device 236, e.g., a collector terminal, is connected to a plane word line 248, which in turn is connected to a common word line 252. The common word line 252 is shown being communicatively coupled to row decode logic 224. While FIG. 2A illustrates a corresponding plane select device 236 located between each local word line 204 and a corresponding plane word line 248/250, embodiments of the present disclosure are not so limited. A plane select device may be located between less than all local word lines and corresponding plane word lines, and/or present with respect to some planes and not present with respect to other planes, etc. For example, embodiments of the present disclosure may include a plane select device between one or more local word lines 204 (of one or more planes) and a corresponding plane word line.

A terminal of each memory cell 202 in a column is shown being communicatively coupled to a local bit line 206. One end of the local bit line 206 is shown being connected to a resistance 228, and the other end of the local bit line 206 is shown being connected to a first terminal of a corresponding plane select device 238, e.g., an emitter terminal of a three-terminal OTS.

However, embodiments of the present disclosure are not limited to the specific configuration illustrated in FIG. 2A, particularly with respect to the location of resistance 228 and/or the plane select device 238. That is, resistance 228 need not be located at an opposite ends of the local bit line 206 from corresponding plane select device 238, and may be located nearer to the corresponding plane select device 238 and/or be distributed resistance, e.g., embodied in a plurality of discrete resistive elements located in series with the local bit line 206 and/or resistance resulting from the material used to form the local bit line 206. The plane select device 238 can also located differently than shown in FIG. 2A in some configurations. For example, plane select device 238 and/or resistance 228 may be located away from the ends of the local bit line 206, such as near the center of the local bit line 206, among other locations. In another example, plane select device 238 and resistance 228 may be exchanged with respect to the locations shown in FIG. 2A.

A second terminal of the corresponding plane select device 238, e.g., a collector terminal, is connected to a plane bit line 256, which in turn is connected to a common bit line 258. The common bit line 258 is shown being communicatively coupled to column decode logic 226. While FIG. 2A illustrates a corresponding plane select device 238 located between each local bit line 206 and a corresponding plane bit line 254/256, embodiments of the present disclosure are not so limited. A plane select device may be located between less than all local bit lines and corresponding plane bit lines, and/or present with respect to some planes and not present with respect to other planes, etc. For example, embodiments of the present disclosure may include a plane select device between one or more local bit lines 206 (of one or more planes) and a corresponding plane bit line. Furthermore, plane select devices (located in the plane itself) can be used with respect to local word lines and not local bit lines, or local bit lines and not local word lines, or some of each, or all of each in all planes (as shown in FIG. 2A), or only in some planes and not others.

The terminal of resistances 228 and 230 not connected to memory cells 202 can be connected to a supply voltage, e.g., Vcc, as shown in FIG. 2A. The size of resistances 228 and 230 can be selected to limit the current through, and/or voltage across, plane select devices 236 and 238 to operating levels associated with the plane select devices 236 and 238. The size of resistance 228 can be the same or different than the size of resistance 230.

A third terminal, e.g., a base terminal, of each of plane select devices 236 can be connected to a control signal, e.g., plane enable, 240. The configuration shown in FIG. 2A having the base terminal of plane select devices being connected to a plane enable is referred to as a "common base" configuration since the base terminals are commoned together. An appropriate signal on the plane enable 240, which is thereby applied to the base terminal of the plane select device 236, can cause each of plane select devices 236 to conduct between the emitter and collector terminals, thereby communicatively coupling the local word lines 204 to the common word lines 252 through the plane word lines 248 so that the decode logic can operate, e.g., program/read, the word lines of the first plane 220. Plane select devices 236 can continue to conduct so long as the appropriate signal is present on the plane enable 240 and/or the current through and/or voltage across the plane select devices 236 remains above the OTS holding threshold.

A third terminal, e.g., a base terminal, of each of plane select devices 238 can be connected to a plane enable 242 for the first plane 220. An appropriate signal on the plane enable 242, which is thereby applied to the base terminal of the plane select device 238, can cause each of plane select devices 238 to conduct between the emitter and collector terminals, thereby communicatively coupling the local bit lines 206 to the common word lines 252 through the plane bit lines 254 so that the decode logic can operate, e.g., program/read, the bit lines of the first plane 220.

Plane enable 240 and plane enable 242 can be independently operated if not connected together to independently enable continuity to the word lines 204 and/or bit lines 206 of the first plane 220. Alternatively, plane enable 240 and plane enable 242 can be connected such that one signal can enable continuity in both the word lines 204 and bit lines 206 at the same time. In this manner, a single plane enable can be used to enable operation/interrogation of the first plane 220, e.g., select the first plane 220.

With respect to the second plane 222, the connections between memory cells 202, local word lines 204, local bit lines 206 selection devices 236 and 238, plane word lines 250, plane bit lines 254, common word lines 252, common bit lines 258, resistances 228 and 230, and supply voltage Vcc can all be the same as was described with respect to similar features of the first plane 220 and shown in FIG. 2A. However, with respect to the second plane 222, the base terminal of plane select devices 236 can be connected to plane enable 244, and the base terminal of plane select devices 238 can be connected to plane enable 246.

Plane enable 244 and plane enable 246 can be independently operated if not connected together to independently enable continuity to the word lines 204 and/or bit lines 206 of the second plane 222. Alternatively, plane enable 244 and plane enable 246 can be connected such that one signal can enable continuity in both the word lines 204 and bit lines 206 of the second plane 222 at the same time. In this manner, a single plane enable can be used to enable operation/interrogation of the second plane 222, e.g., select the second plane 222.

FIG. 2A shows that the word lines for the plurality of planes, e.g., plane word lines 248 and 250, are connected in parallel to the common word lines 252 leading to the row decode logic 224. Similarly, the bit lines for the plurality of planes, e.g., plane bit lines 256 and 254, are connected in parallel to the common bit lines 258 leading to the column decode logic 226. Since each respective plane can be selected independently, for example using plane enable 240 and 242 to select the first plane 220 or using plane enable 244 and 246 to select the second plane 222, the row decode logic 224 and/or column decode logic 226 can be used for both planes. As such, individual dedicated row 224 and column 226 decode logic is not needed for each plane. Because the row 224 and column 226 decode logic has elements formed in a substrate material, sharing of a single row 224 and column 226 decode logic reduces the footprint of circuits integrated into the semiconductor substrate material.

When a memory cell 202 in a particular plane is to be accessed, e.g., in association with a program or read operation, only the plane select devices 236 and/or 238 on that plane are activated. When any of plane select devices 236 and/or 238 are not operated to be conducting, the plane select devices 236 and/or 238 can provide electrical isolation. In unselected planes, the conductive lines, e.g., local word and bit lines, and memory elements inside the plane are insulated from signals on the periphery by the unselected off-state plane select devices 236 and/or 238, e.g., three-terminal OTS devices. In this manner, the plane select devices 236 and/or 238 can be used to multiplex conductive lines of individual planes to the common word 252 and bit lines 258.

Furthermore, as is illustrated in FIG. 2A, the plane select devices 236 and 238 are located on the respective plane. That is, the plane select devices 236 and 238 can be formed on the same plane as the PCMS cross-point array, for example. Therefore, plane select devices, e.g., transistors, need not be formed in the substrate material thereby reducing footprint of circuits integrated into the semiconductor substrate material.

According to some embodiments, the plane select and plane word/bit line multiplexing techniques of the present disclosure are implemented utilizing plane select devices, e.g., transistors, formed in the substrate material. For example, where there is sufficient area under the memory array and within the boundaries of the memory array to accommodate plane selection devices formed in the substrate material, some or all of the plane select devices can be formed in the substrate material so as to realize the footprint savings of sharing decoding logic among multiple planes via multiplexing plane word/bit lines.

Although FIG. 2A shows plane select devices corresponding to local word lines 204 and local bit lines 206, embodiments of the present disclosure are not so limited. Plane select devices can be utilized to connect and isolate other conductive lines associated with a particular plane, such as other signal lines. In addition, the matrix of memory cells 202 in a particular plane 220/222 can be further divided, e.g., into pages, blocks, or other physical or logical groups, and plane select devices arranged and configured so as to provide the capability to independently select portions of the particular plane, for example. Although FIG. 2A only shows one plane select device per conductive line, embodiments are not so limited, and one or more plane select device can be used to further isolate portions of conductive lines and/or certain memory cells and/or other control circuitry. Implementations are not limited to the location, quantity, orientation, or configuration of the plane select devices, and other arrangements and configurations that achieve individual plane selection to facilitate signal multiplexing in order to reduce duplicative circuits and elements thereof formed in the substrate material beneath a memory array are contemplated.

Figure 2B:
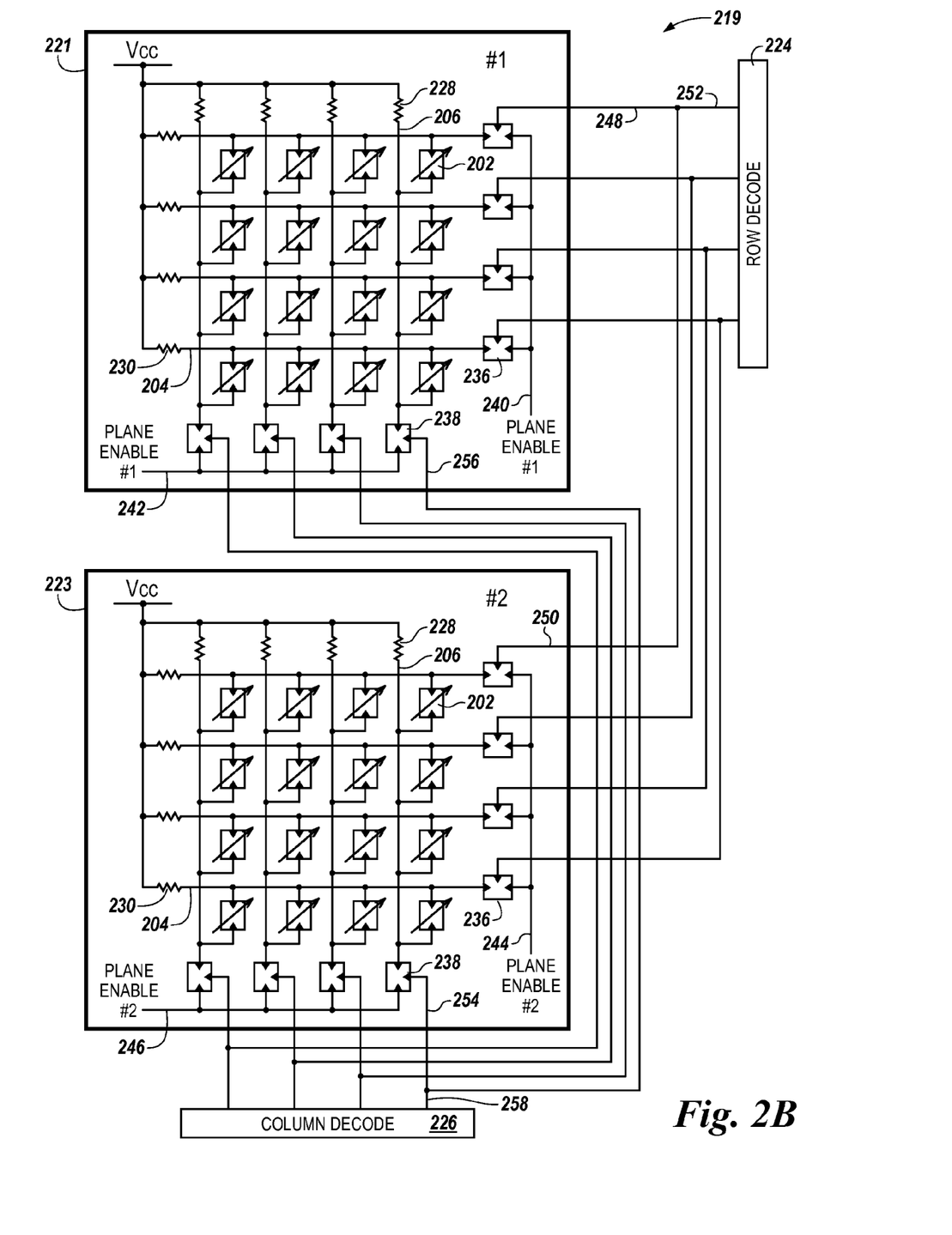
FIG. 2B is a schematic representation of a portion of a memory array formed having three-terminal plane select devices in a "common collector" configuration of plane isolation in accordance with a number of embodiments of the present disclosure.

FIG. 2B is a schematic representation of a portion of a memory array 219 formed having three-terminal plane select devices 236/238 in a "common collector" configuration of plane isolation in accordance with a number of embodiments of the present disclosure. The memory array 219 is shown having a plurality of planes, including a first plane 221 and a second plane 223. As shown in FIG. 2B, the connections are the same as those shown in FIG. 2A with the exception that the plane select devices 236/238 of memory array 219 are interconnected in a "common collector" configuration. That is, one terminal of plane select device 236, e.g., an emitter terminal of a three-terminal OTS, is connected to the local word line 204. The second terminal of the corresponding plane select device 236, e.g., a collector terminal, is connected to the plane enable 240 (rather than to a plane word line 248 as shown in FIG. 2A). The third terminal of plane select device 236, e.g., a base terminal, is connected to the plane word line 248. An appropriate signal on the plane enable 240, which is thereby applied to the collector terminal of the plane select device 236, can cause each of plane select devices 236 to conduct between the emitter and base terminals, thereby communicatively coupling the local word lines 204 to the common word lines 252 through the plane word lines 248.

Similarly, one terminal of plane select device 238, e.g., an emitter terminal, is connected to the local bit line 206. The second terminal of the corresponding plane select device 238, e.g., a collector terminal, is connected to the plane enable 242 (rather than to a plane bit line 256 as shown in FIG. 2A). The third terminal of plane select device 238, e.g., a base terminal, is connected to the plane bit line 256. An appropriate signal on the plane enable 242, which is thereby applied to the collector terminal of the plane select device 238, can cause each of plane select devices 238 to conduct between the emitter and base terminals, thereby communicatively coupling the local bit lines 206 to the common bit lines 258 through the plane word lines 256. The plane select device 236 and 238 of the second 223 are likewise connected in a common collector configuration to plane enables 244 and 246 respectively.

Figure 3:
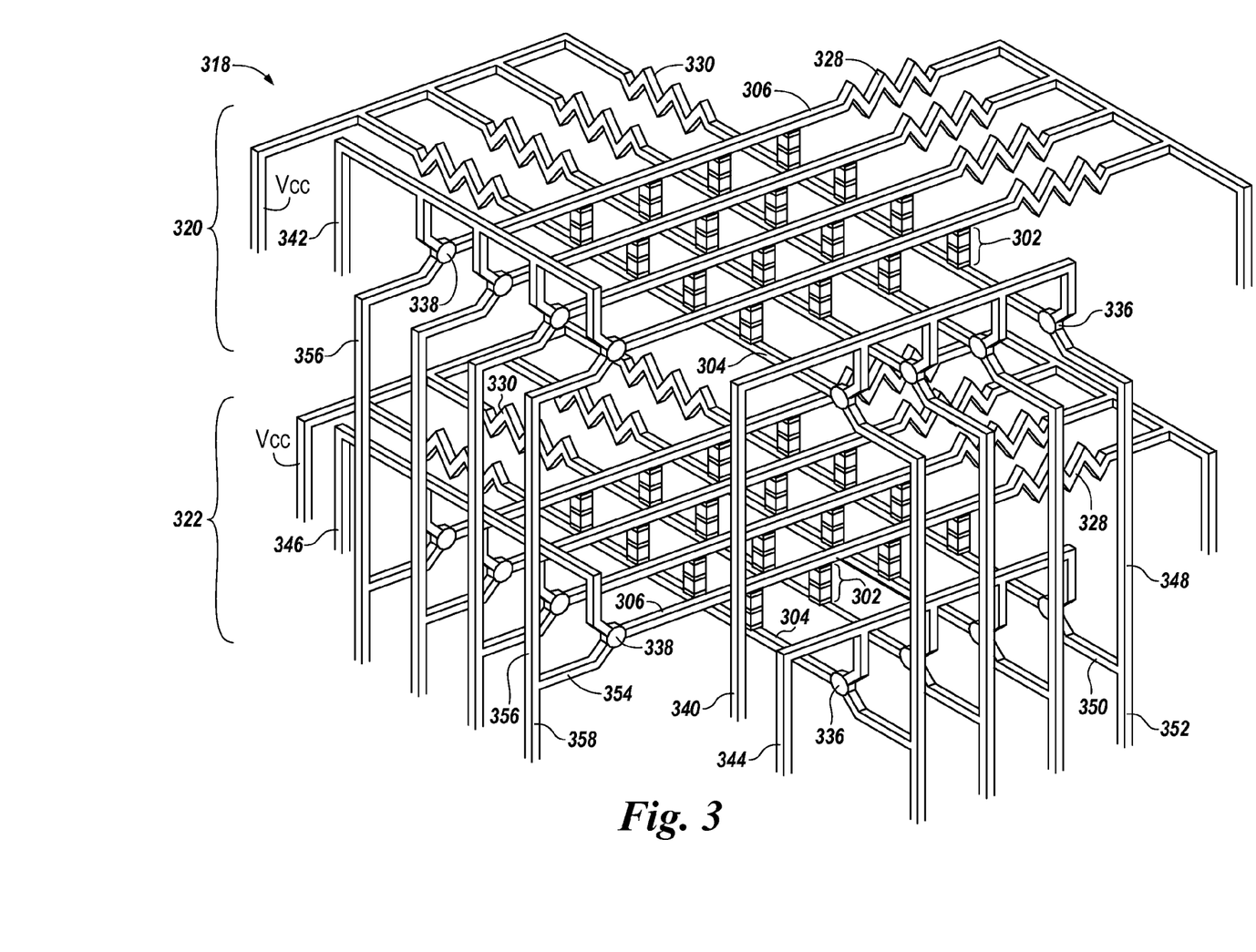
FIG. 3 illustrates a perspective view of a portion of a memory array formed having a "common base" configuration of plane isolation in accordance with a number of embodiments of the present disclosure.

FIG. 3 illustrates a perspective view of a portion of a memory array 318 formed having a "common base" configuration of plane isolation in accordance with a number of embodiments of the present disclosure. FIG. 3 is a perspective view of one example implementation of the memory array 218 shown schematically in FIG. 2A. FIG. 3 shows a memory array 318 including a plurality of memory cells 302. The memory array 318 is shown having a plurality of planes, including a first plane 320, e.g., upper plane, and a second plane 322, e.g., lower plane.

The memory cells 302 of each plane are shown being arranged into a cross point architecture of rows and columns, e.g., a 4×4 matrix. One terminal of each memory cell 302 in a row is shown being connected to a local word line 304. One end of the local word line 304 is shown being connected to a resistance 330, and the other end of the local word line 304 is shown being connected to a first terminal of a corresponding plane select device 336, e.g., an emitter terminal of a three-terminal OTS. However, and as discussed with respect to FIG. 2A, embodiments of the present disclosure are not limited to the specific configuration illustrated in FIG. 3, particularly with respect to the location of resistance 330, which may be located differently in series with local word line 304 and/or be comprised of the resistance along the local word line 304.

A second terminal of plane select device 336, e.g., a collector terminal, is connected to a plane word line 348, which in turn is connected to a common word line 352. The common word line 352 is shown, which leads to the row decode logic (not shown in FIG. 3).

A terminal of each memory cell 302 in a column is shown being communicatively coupled to a local bit line 306. One end of the local bit line 306 is shown being connected to a resistance 328, and the other end of the local bit line 306 is shown being connected to a first terminal of a corresponding plane select device 338, e.g., an emitter terminal. However, and as discussed with respect to FIG. 2A, embodiments of the present disclosure are not limited to the specific configuration illustrated in FIG. 3, particularly with respect to the location of resistance 328, which may be located differently in series with local bit line 306 and/or be comprised of the resistance of the local bit line 306.

A second terminal of plane select device 338, e.g., a collector terminal, is connected to a plane bit line 356, which in turn is connected to a common bit line 358. The common bit line 358 is shown, which leads to column decode logic (not shown in FIG. 3). One terminal of resistances 328 and 330 can be connected to a supply voltage, e.g., Vcc.

A third terminal, e.g., a base terminal, of each plane select device 336 can be connected to a plane enable 340 for the first plane 320. The configuration shown in FIG. 3 is a "common base" configuration, with the base terminal of plane select devices 336 being connected to the plane enable 340. A third terminal, e.g., a base terminal, of each of plane select devices 338 can be connected to a plane enable 342 for the first plane 320. The plane enables 340 and 342 can be connected together (to select entire plane) or isolated from one another (to allow selection of the word line and bit line independent from one another).

With respect to the second plane 322, the connections between memory cells 302, local word lines 304, local bit lines 306 selection devices 336 and 338, plane word lines 350, plane bit lines 354, common word lines 352, common bit lines 358, resistances 328 and 330, and supply voltage Vcc can all be the same as was described with respect to similar features of the first plane 320 and shown in FIG. 3. However, with respect to the second plane 322, the base terminal of plane select devices 336 can be connected to plane enable 344, and the base terminal of plane select devices 338 can be connected to plane enable 346.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory array, comprising:
    a plurality of planes each having a plurality of memory cells arranged in a matrix and a plurality of plane selection devices, groups of the plurality of memory cells being communicatively coupled to a respective one of a plurality of plane selection devices, wherein a first plane is associated with a first number of access lines and a second plane is associated with a second number of access lines; and
    a decode logic having elements formed in a substrate material and communicatively coupled to the plurality of plane selection devices,
    wherein the first number of access lines and the second number of access lines are respectively coupled in parallel to a number of common access lines that are communicatively coupled to the decode logic, and
    wherein the plurality of memory cells and the plurality of plane selection devices are not formed in the substrate material.

2. The memory array of claim 1, wherein each of the plurality of memory cells is communicatively coupled to a respective pair of the plurality of plane selection devices.

3. The memory array of claim 1, wherein elements of the decode logic include transistors formed in a silicon substrate material, and the plurality of plane selection devices are thin film devices.

4. The memory array of claim 1, wherein each of the plurality of plane select devices are an ovonic threshold switch (OTS).

5. The memory array of claim 4, wherein each of the plurality of plane select devices is a three-terminal OTS.

6. The memory array of claim 5, wherein a first terminal of the three-terminal OTS is communicatively coupled in parallel to a group of the plurality of memory cells, a second terminal of the three-terminal OTS is communicatively coupled to the decode logic, and a third terminal of the three-terminal OTS is communicatively coupled to a plane enable control line.

7. The memory array of claim 6, wherein the three-terminal OTS is communicatively coupled to the plane enable control line in a common base configuration.

8. The memory array of claim 6, wherein the three-terminal OTS is communicatively coupled to the plane enable control line in a common collector configuration.

9. The memory array of claim 1, wherein each memory cell includes a storage device and a thin film cell select device.

10. The memory array of claim 9, wherein each memory cell is a phase change material and switch (PCMS) device.

11. The memory array of claim 10, wherein the cell select device is a two-terminal OTS formed in series with the phase change material.

12. A method of forming a memory array, comprising:
    forming decode circuitry in a substrate material;
    forming at least one plane having phase change material and switch (PCMS) memory cells arranged in a matrix and a plane select device,
    wherein a group of the PCMS memory cells are communicatively coupled to a conductive line, and the conductive line is communicatively coupled to the decode circuitry directly from the plane select device.

13. The method of claim 12, wherein forming the plane select device includes forming a three-terminal ovonic threshold switch (OTS) in a common base configuration, the common base connected to a respective plane enable signal.

14. The method of claim 12, wherein forming the plane select device includes forming a three-terminal ovonic threshold switch (OTS) in a common collector configuration, the common base connected to a respective plane enable signal.

* * * * *